(12) United States Patent  
Li et al.

(10) Patent No.: US 11,120,991 B2  
(45) Date of Patent: Sep. 14, 2021

(54) LATERAL SEMICONDUCTOR NANOTUBE WITH HEXAGONAL SHAPE

(71) Applicant: International Business Machines Corporation, Armonk, NY (US)

(72) Inventors: Juntao Li, Cohoes, NY (US); Kangguo Cheng, Schenectady, NY (US); Peng Xu, Santa Clara, CA (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/589,687

(22) Filed: Oct. 1, 2019

(65) Prior Publication Data

US 2020/0035488 A1 Jan. 30, 2020

Related U.S. Application Data

(62) Division of application No. 15/852,147, filed on Dec. 22, 2017, now Pat. No. 10,622,208.

(51) Int. Cl.

| | |
|---|---|
| *H01L 21/02* | (2006.01) |
| *H01L 29/06* | (2006.01) |
| *H01L 21/306* | (2006.01) |
| *H01L 29/66* | (2006.01) |
| *H01L 29/786* | (2006.01) |
| *H01L 29/423* | (2006.01) |
| *H01L 21/3065* | (2006.01) |
| *B82Y 40/00* | (2011.01) |
| *H01L 29/49* | (2006.01) |

(52) U.S. Cl.
CPC .... *H01L 21/02606* (2013.01); *H01L 21/0228* (2013.01); *H01L 21/0245* (2013.01); *H01L 21/02381* (2013.01); *H01L 21/02494* (2013.01); *H01L 21/02516* (2013.01); *H01L 21/02532* (2013.01); *H01L 21/02664* (2013.01); *H01L 21/3065* (2013.01); *H01L 21/30621* (2013.01); *H01L 29/0649* (2013.01); *H01L 29/42384* (2013.01); *H01L 29/66227* (2013.01); *H01L 29/66439* (2013.01); *H01L 29/66742* (2013.01); *H01L 29/78684* (2013.01); *H01L 29/78696* (2013.01); *B82Y 40/00* (2013.01); *H01L 21/02639* (2013.01); *H01L 29/4983* (2013.01)

(58) Field of Classification Search
None
See application file for complete search history.

(56) References Cited

U.S. PATENT DOCUMENTS

| | | | |
|---|---|---|---|
| 7,211,143 B2 | 5/2007 | Yang et al. | |
| 7,622,773 B2 * | 11/2009 | Irisawa | H01L 29/78687 257/347 |

(Continued)

OTHER PUBLICATIONS

List of IBM Patents or Patent Applications Treated as Related.

*Primary Examiner* — Long Pham
(74) *Attorney, Agent, or Firm* — Randall Bluestone; Ryan, Mason & Lewis, LLP

(57) ABSTRACT

A method of forming a semiconductor structure includes forming one or more fins disposed on a substrate, rounding surfaces of the one or more fins, forming faceted sidewalk from the rounded surfaces of the one or more fins, and forming a lateral semiconductor nanotube shell on the faceted sidewalk. The lateral semiconductor nanotube shell comprises a hexagonal shape.

20 Claims, 9 Drawing Sheets

(56) References Cited

U.S. PATENT DOCUMENTS

| | | | |
|---|---|---|---|
| 8,211,705 B2* | 7/2012 | Carella | G01N 27/414 |
| | | | 436/81 |
| 8,680,510 B2 | 3/2014 | Bangsaruntip et al. | |
| 8,871,576 B2* | 10/2014 | Tekleab | B82Y 10/00 |
| | | | 438/157 |
| 9,620,633 B2 | 4/2017 | Huang et al. | |
| 9,761,661 B2 | 9/2017 | Ando et al. | |
| 9,768,252 B2* | 9/2017 | Holland | H01L 21/02538 |
| 9,779,999 B2 | 10/2017 | Xiao | |
| 2005/0233585 A1* | 10/2005 | Lai | H01L 29/0673 |
| | | | 438/678 |
| 2011/0210309 A1* | 9/2011 | Ben-Ishai | H01L 29/0665 |
| | | | 257/9 |
| 2012/0138886 A1 | 6/2012 | Kuhn et al. | |
| 2012/0217468 A1 | 8/2012 | Tekleab et al. | |
| 2013/0075797 A1 | 3/2013 | Okano | |
| 2014/0183452 A1 | 7/2014 | Hirai et al. | |
| 2016/0027872 A1 | 1/2016 | Hirai et al. | |
| 2017/0069492 A1* | 3/2017 | Cheng | H01L 21/02532 |
| 2017/0110374 A1 | 4/2017 | Xu et al. | |
| 2019/0198319 A1* | 6/2019 | Li | H01L 21/02664 |
| 2020/0035488 A1* | 1/2020 | Li | B82Y 10/00 |

\* cited by examiner

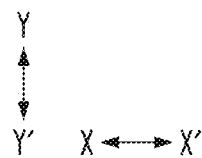
FIG. 1
100
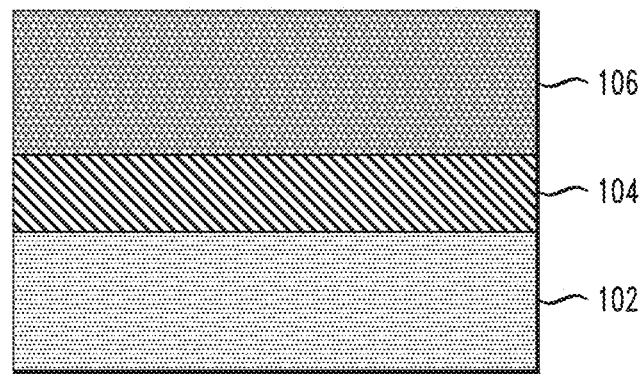
FIG. 2
200
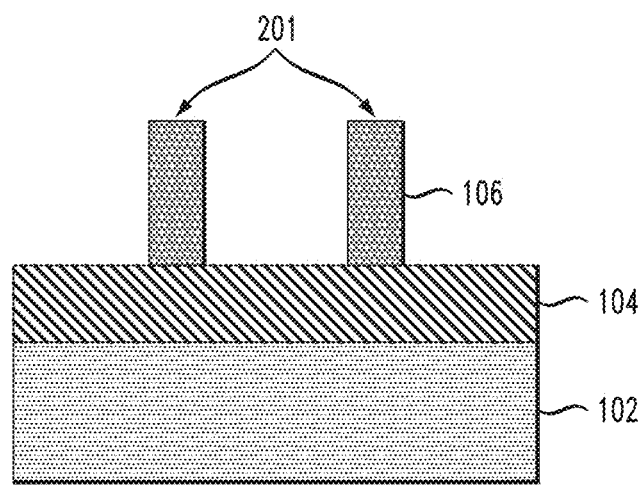

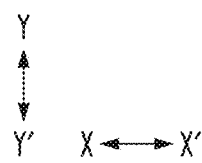
*FIG. 3*
300
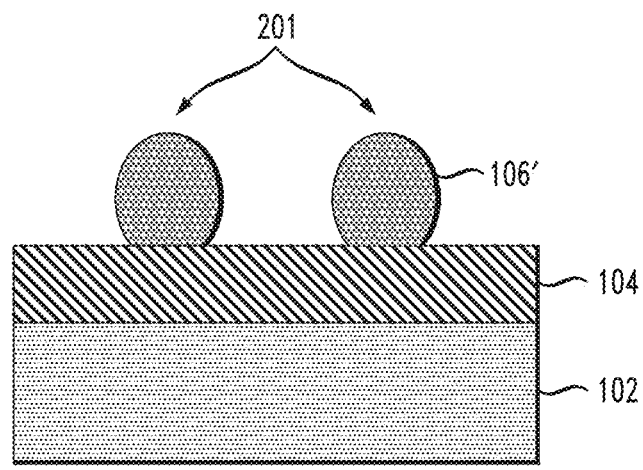
*FIG. 4*
400
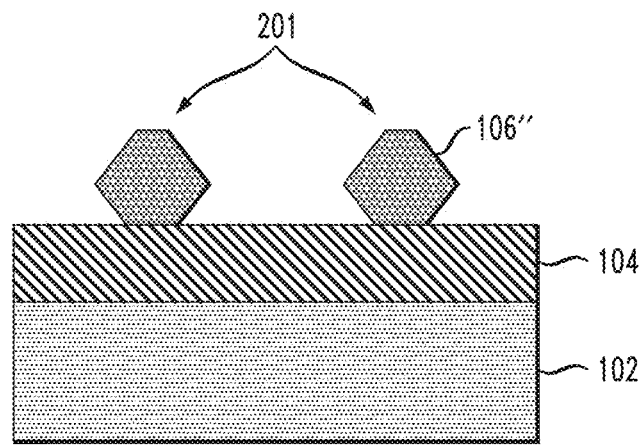

1000

1100

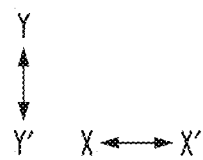
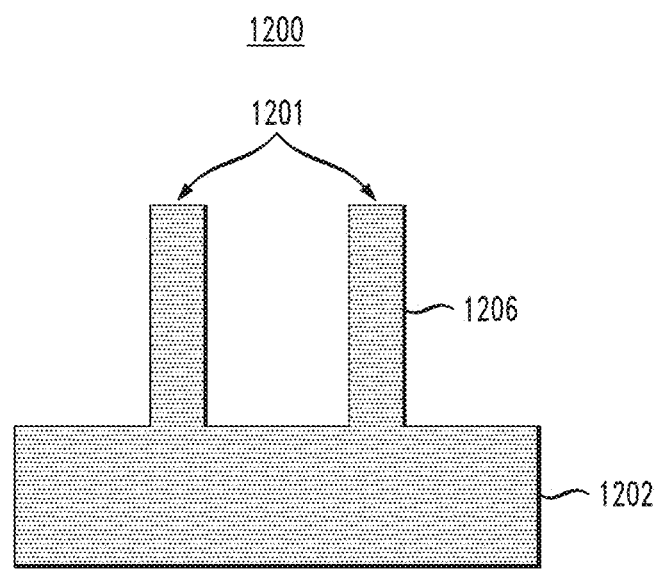
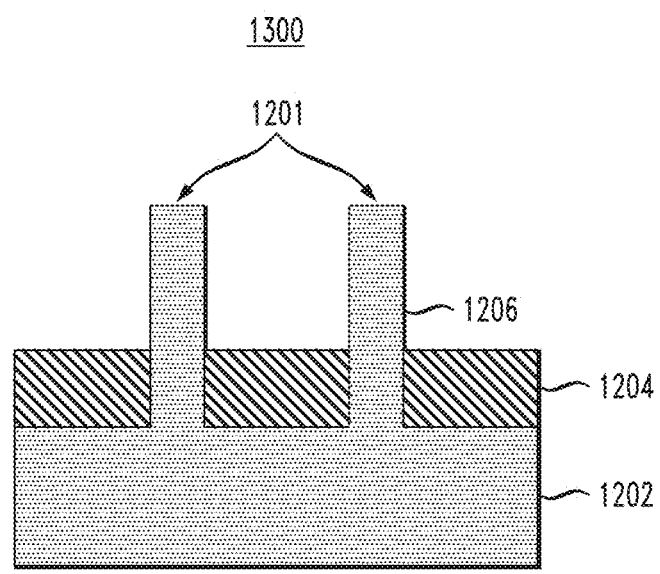

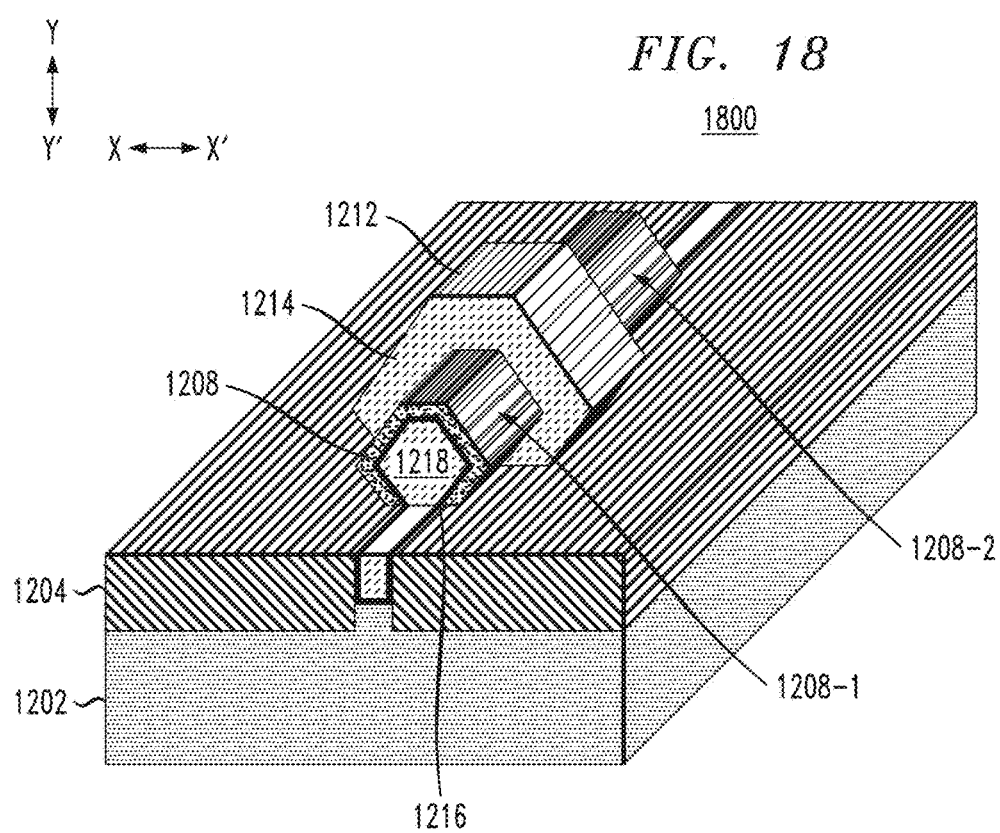
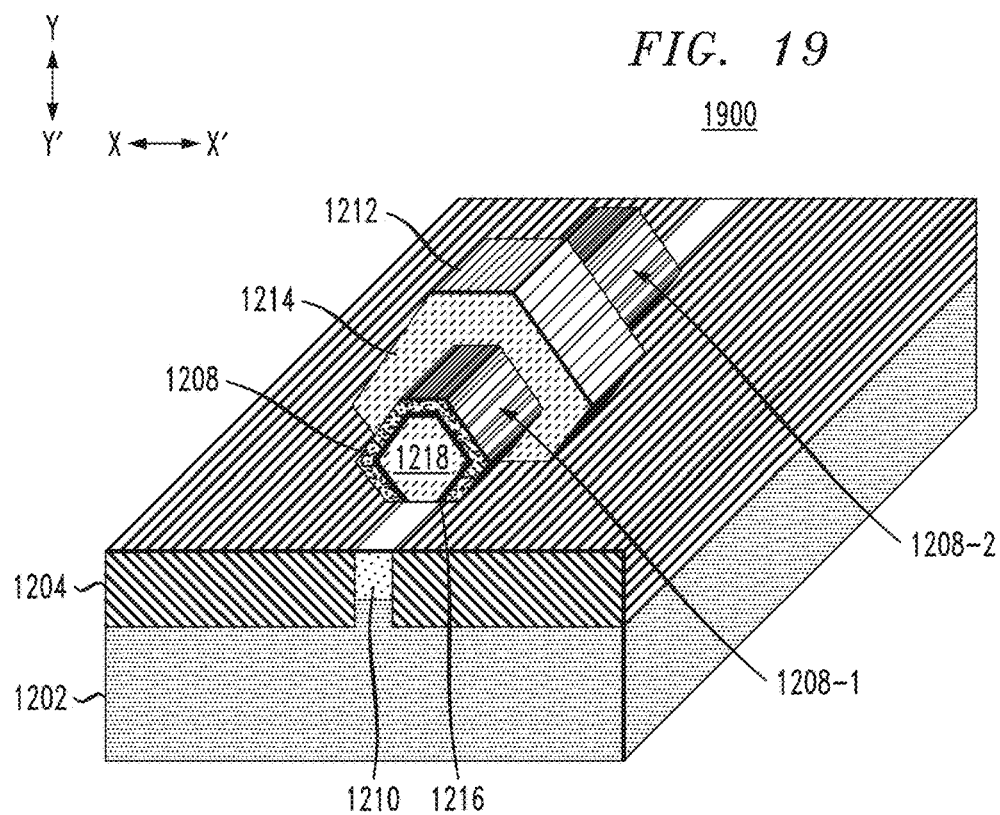

LATERAL SEMICONDUCTOR NANOTUBE WITH HEXAGONAL SHAPE

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming lateral semiconductor nanotubes with hexagonal shape.

In one embodiment, a method of forming a semiconductor structure comprises forming one or more fins disposed on a substrate, rounding surfaces of the one or more fins, forming faceted sidewalk from the rounded surfaces of the one or more fins, and forming a lateral semiconductor nanotube shell on the faceted sidewalls. The lateral semiconductor nanotube shell comprises a hexagonal shape.

In another embodiment, a semiconductor structure comprises a substrate and a lateral semiconductor nanotube shell disposed on a top surface of the substrate. The lateral semiconductor nanotube shell comprises a hexagonal shape.

In another embodiment, an integrated circuit comprises a lateral nanotube transistor comprising a substrate and a lateral semiconductor nanotube shell disposed on a top surface of the substrate. The lateral semiconductor nanotube shell comprises a hexagonal shape.

BRIEF DESCRIPTION OF THE DRAWINGS

FIG. 1 depicts a side cross-sectional view of a semiconductor structure with a semiconductor layer disposed over a silicon-on-insulator substrate, according to an embodiment of the invention.

FIG. 2 depicts a side cross-sectional view of the semiconductor structure shown in FIG. 1 following formation of fins in the semiconductor layer, according to an embodiment of the invention.

FIG. 3 depicts a side cross-sectional view of the semiconductor structure shown in FIG. 2 following annealing, according to an embodiment of the invention.

FIG. 4 depicts a side cross-sectional view of the semiconductor structure shown in FIG. 3 following etching to form faceted fins, according to an embodiment of the invention.

FIG. 12 depicts a side cross-sectional view of fins formed in a semiconductor substrate, according to an embodiment of the invention.

FIG. 13 depicts a side cross-sectional view of the semiconductor structure shown in FIG. 12 following formation of a dielectric on a top surface of the substrate surrounding the fins, according to an embodiment of the invention.

FIG. 18 depicts a perspective view of a hexagonal nanotube transistor with an inner gate formed from a bulk semiconductor substrate, according to an embodiment of the invention.

FIG. 19 depicts a perspective view of a hexagonal nanotube transistor with an inner gate and an insulator in an indent region, according to an embodiment of the invention.

DETAILED DESCRIPTION

Figure 5:
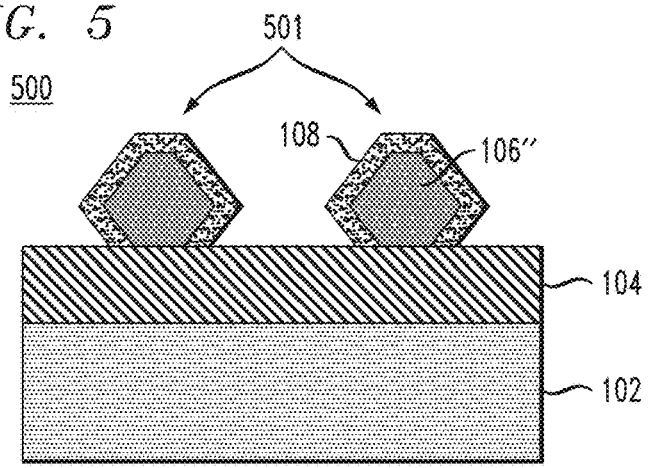
FIG. 5 depicts a side cross-sectional view of the semiconductor structure shown in FIG. 4 following epitaxial growth on the faceted sidewalls of the fins, according to an embodiment of the invention.

Illustrative embodiments of the invention may be described herein in the context of illustrative methods for forming lateral semiconductor nanotubes with hexagonal shape, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (NFET and PFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Nanotubes have a wide variety of applications. Although carbon nanotubes are increasingly used, it is extremely challenging to make large numbers of carbon nanotubes consistently and uniformly on the same chip (e.g., such as making billions of carbon nanotube transistors on a chip). In contrast, silicon-based nanotubes are attractive, owing to the maturity of semiconductor technology.

Techniques for forming single-crystal silicon germanium (SiGe) nanotubes with a controlled shape (e.g., hexagonal SiGe nanotubes) are needed. SiGe nanotubes allow for formation of transistors, for example, that are smaller with lower power consumption. Horizontal SiGe nanotubes, however, are difficult to form. Conventional patterning techniques may be used to form nanotube pillars, but not horizontal nanotubes. SiGe nanotubes have higher carrier mobility than silicon (Si) nanotubes, and thus allow for faster switching and corresponding better speed. Carrier mobility may differ from one plane to another. The {111} crystalline orientation provides a good balance for both electron (e.g., for n-type transistors) and hole (e.g., for p-type transistors) mobility.

Embodiments provide methods and structures for forming single-crystal SiGe nanotubes with a substantially uniform thickness. In some embodiments, the sidewalls of the SiGe nanotubes comprise primarily {111} crystalline orientation planes. Hexagonal SiGe nanotubes formed using the techniques described herein have a greater surface area than a vertical rectangular nanotube with the same height. When SiGe nanotubes formed as described herein are used for fabricating a MOS transistor, this greater surface area translates to a greater device width and thus higher drive current.

Illustrative processes for forming hexagonal nanotubes will now be described with respect to FIGS. 1-19.

FIG. 1 depicts a side cross-sectional view 100 of a semiconductor structure, comprising a substrate 102, a buried oxide or insulator (BOX) layer 104 disposed over the substrate, and a semiconductor layer 106 disposed over the BOX layer 104.

In some embodiments, the substrate 102 comprises a semiconductor substrate formed of silicon (Si), although other suitable materials may be used. For example, the substrate 102 can include any suitable substrate structure, e.g., a bulk semiconductor. FIG. 1 more particularly illustrates a semiconductor-on insulator (SOI) arrangement, with BOX layer 104 over the substrate 102. The substrate 102 can include a silicon-containing material. Illustrative examples of Si-containing materials suitable for the substrate 102 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc.

The substrate 102 may have a width or horizontal thickness (X-X') selected as desired based on a number of fins or other features to be formed thereon. The substrate 102 may have a height or vertical thickness (in direction Y-Y') in the range of 0.5 millimeters (mm) to 1.5 mm, although other heights above or below this range may be used as desired for a particular application.

The BOX layer 104 may be formed of any suitable oxide or insulator such as silicon oxide (SiO), silicon nitride (SiN), silicon oxynitride (SiON), or other suitable dielectric materials. The BOX layer 104 may have a height or vertical thickness (in direction Y-Y') in the range of 10 nanometers (nm) to 1000 nm, although other heights above or below this range may be used as desired for a particular application.

The semiconductor layer 106 may be formed of Si, although other suitable materials such as germanium (Ge), SiGe, III-V compound semiconductor (e.g., GaAs), II-V compound semiconductor (e.g., ZnSe), etc. may be used. The semiconductor layer 106 may have a height or vertical thickness (in direction Y-Y') in the range of 5 nm to 50 nm, although other heights above or below this range may be used as desired for a particular application.

FIG. 2 depicts a side cross-sectional view 200 of the semiconductor structure shown in FIG. 1 following formation of fins 201 from the semiconductor layer 106. The fins 201 may be formed using sidewall image transfer (SIT) or other suitable techniques such as lithography and etching, etc. Each of the fins 201 may have a width or horizontal thickness (in direction X-X') in the range of 5 nm to 50 nm, although other widths above or below this range may be used as desired for a particular application.

FIG. 3 depicts a side cross-sectional view 300 of the semiconductor structure shown in FIG. 2 following an anneal process. The anneal process is in an environment that rounds surfaces in the semiconductor layer 106' of the fins 201. In some embodiments, the anneal process is a hydrogen anneal at 880 degrees Celsius (° C.) for a duration of 30 seconds. Other suitable anneal processes that may be used for rounding the surfaces of the fins include a hydrogen anneal at 900° C. for 10 seconds, or other suitable anneal processes that form rounded surfaces of the fins as illustrated.

FIG. 4 depicts a side cross-sectional view 400 of the semiconductor structure shown in FIG. 3 following etching to form faceted surfaces in the semiconductor layer 106" on the fins 201. The faceted surfaces may form hexagonal-shaped fins 201 of the semiconductor layer 106". The etching of FIG. 4 may be in hydrogen chloride (HCl) vapor. The HCl etch is strongly dependent on orientation, thus when the material of the semiconductor layer 106" (e.g., Si) reaches a {111} crystalline orientation, the HCl etch stops. As a result, most of the surfaces of the semiconductor layer 106" have a {111} crystalline orientation. In some embodiments, the anneal process is a hydrogen chloride (HCl) vapor etch at 600 degrees Celsius (° C.) for a duration of 30 seconds, although other etchings may be used which form faceted sidewalls as illustrated.

FIG. 5 depicts a side cross-sectional view 500 of the semiconductor structure shown in FIG. 4 following epitaxially growth of semiconductor shells 108 on the faceted sidewalls of semiconductor layer 106" in each of the fins 201. The semiconductor shells 108 may be formed of SiGe although other suitable materials such as germanium (Ge) may be used. The semiconductor shells 108 form horizontal semiconductor nanotubes 501, which may be hexagonal-shaped as described. The horizontal semiconductor nanotubes 501 may have a uniform thickness in the range of 2 nm to 10 nm although other suitable thicknesses above or below this range may be used as desired for a particular application. In some embodiments, the processing described above with respect to FIGS. 3-5 is performed in a same epitaxy chamber.

Figure 6:
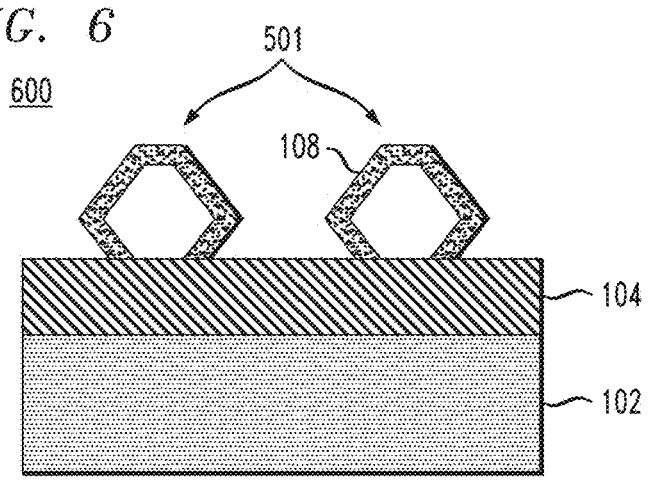
FIG. 6 depicts a side cross-sectional view of the semiconductor structure shown in FIG. 5 following removal of the semiconductor layer inside the semiconductor shell, according to an embodiment of the invention.

FIG. 6 depicts a side cross-sectional view 600 of the semiconductor structure shown in FIG. 5 following removal of the core semiconductor layer 106" that is surrounded by the semiconductor shells 108 in each of the horizontal semiconductor nanotubes 501. The semiconductor layer 106" may be removed using a selective etch process which removes a material of the semiconductor layer 106" selective to a material of the semiconductor shells 108. For example, if the semiconductor layer 106" is formed of Si and the semiconductor shells 108 is formed of SiGe, the selective etch may comprise an aqueous solution containing ammonia ($NH_4OH$).

Figure 7:
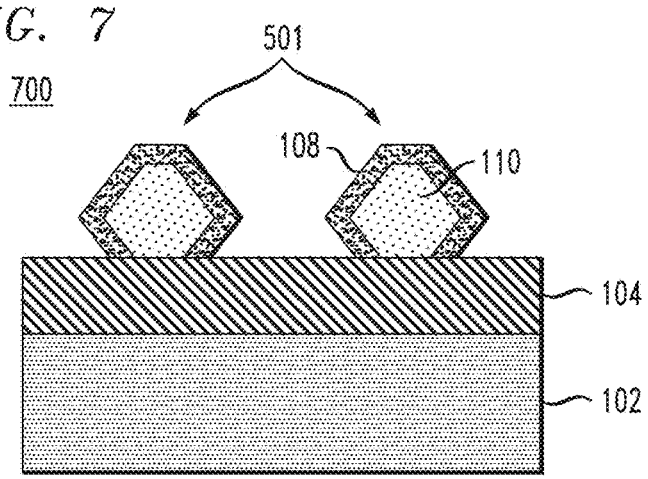
FIG. 7 depicts a side cross-sectional view of the semiconductor structure shown in FIG. 6 following filling the semiconductor shell with an insulator, according to an embodiment of the invention.

FIG. 7 depicts a side cross-sectional view 700 of the semiconductor structure shown in FIG. 6 following filling of the semiconductor shells 108 of the horizontal semiconductor nanotubes 501 with an insulator 110. The insulator 110 may be an oxide or other suitable material such as SiO, SiON, silicon oxycarbide (SiCO)), etc. The insulator 110 may be formed by filling with an oxide followed by etch back to expose outer sidewalls of the horizontal semiconductor nanotubes 501.

In other embodiments, as will be described in further detail below, an inner gate may be formed inside the semiconductor shells 108 of the horizontal semiconductor nanotubes 501. In such embodiments, a gate dielectric may be formed on inner sidewalls of the horizontal nanotubes 501 followed by fill with a gate conductor.

The gate dielectric can comprise silicon oxide, silicon nitride, silicon oxynitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum, aluminum, magnesium. The gate dielectric may be formed by using a conformal deposition process such as atomic layer deposition (ALD) or chemical vapor deposition (CVD) processing, although other suitable processes may be used. The gate dielectric may have a uniform thickness in the non-limiting range of 1 nm to 3 nm.

The gate conductor may be formed of any suitable conducting material, including but not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. In some embodiments, the gate conductor includes a work function metal layer to set the threshold voltage of the transistor to a desired value. The work function layer may be a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC), titanium aluminum carbide (TiAlC), tantalum carbide (TaC), hafnium carbide (HfC), and combinations thereof. The gate conductor can be formed by using a conformal deposition process such as ALD or CND processing, although other suitable processes may be used.

Figure 8:
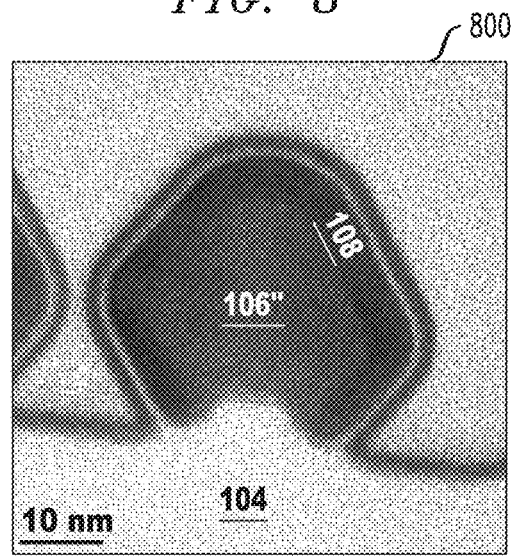
FIG. 8 depicts an image of a hexagonal nanotube, according to an embodiment of the invention.

FIG. 8 depicts an image 800 of a horizontal semiconductor nanotube. More particularly, the image 800 is a cross-sectional view of a hexagonal semiconductor nanotube formed as described above with respect to FIGS. 1-5. The image 800 shows the BOX layer 104, the faceted semiconductor core 106" (e.g., formed of Si) and the semiconductor shell 108 (e.g., formed of SiGe). The image 800 shows a substantially hexagonal shape formed using the three-step anneal, etch and epitaxial growth technique described above with respect to FIGS. 3-5.

Figure 9:
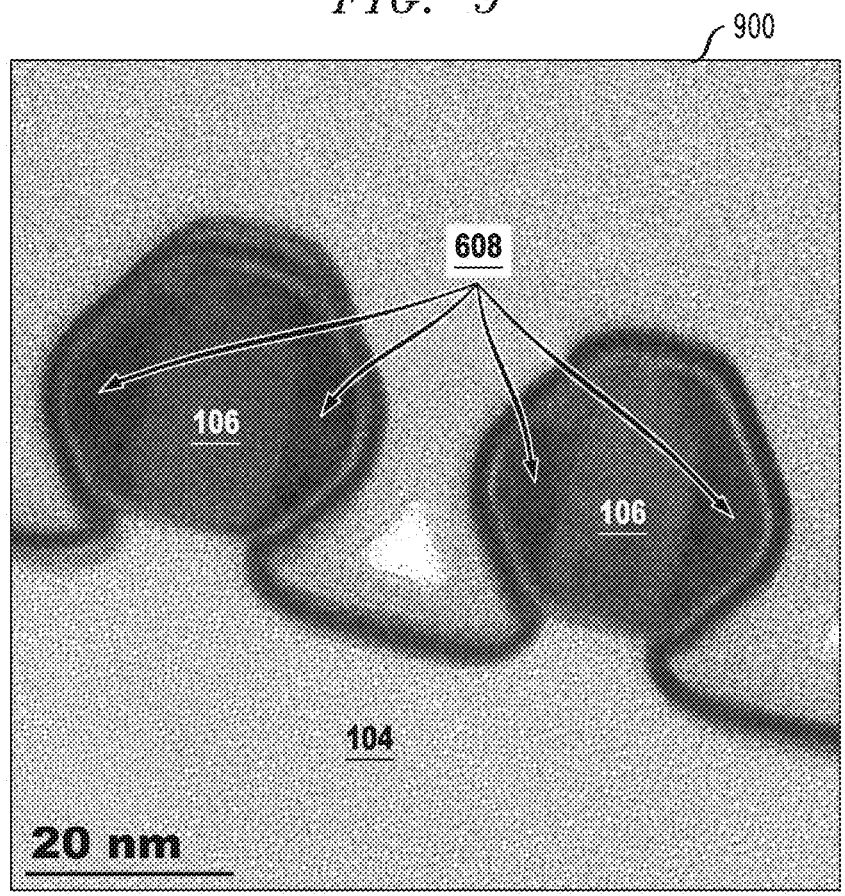
FIG. 9 depicts an image of fins following an insufficient anneal, according to an embodiment of the invention.

FIG. 9 depicts an image 900 of fins, wherein the anneal of the three-step anneal, etch and epitaxial growth technique is insufficient. The image shows BOX layer 104, with the semiconductor layer 106 (e.g., the semiconductor layer without rounding). As the semiconductor layer 106 is not rounded, the epitaxial growth is not uniform and thus a resulting nanotube would not have uniform thickness. In the FIG. 9 example, the anneal process was at 800° C. for a duration of 30 seconds, compared with the anneal process at 880° C. for the duration of 30 seconds described above with respect to FIG. 3. It is to be appreciated, however, that the anneal need not be at 880° C., and that other temperatures and durations of the anneal process may be used so as to form the rounded shape desired. Due to insufficient rounding in the anneal step, a hexagonal core is not formed in the subsequent etch and the semiconductor shell 608 is not uniform as shown.

Figure 10:
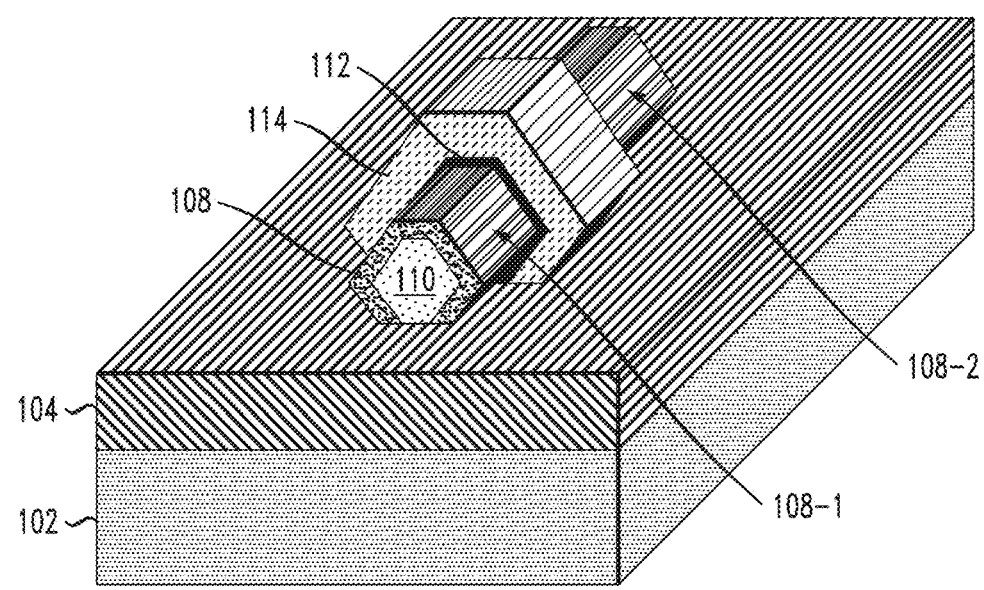
FIG. 10 depicts a perspective view of a hexagonal nanotube transistor, according to an embodiment of the invention.

FIG. 10 depicts a perspective view 1000 of a hexagonal nanotube transistor formed using techniques described above with respect to FIGS. 1-7. The hexagonal nanotube transistor includes substrate 102, BOX layer 104, horizontal semiconductor nanotube shell 108, an insulator core 110 formed in the nanotube shell 108, a gate dielectric 112 surrounding a portion of the nanotube shell 108 in a gate region, and a gate conductor 114 surrounding the gate dielectric 112 in the gate region. The nanotube shell 108 provides a source 108-1 for the hexagonal nanotube transistor, a drain 108-2 for the hexagonal nanotube transistor, and a channel (not labeled) formed below the gate region (e.g., below the gate dielectric 112 and gate conductor 114).

Portions of the nanotube shell 108 which provide the source 108-1 and drain 108-2 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). In some embodiments, epitaxy growth can be used to grow additional material in source/drain regions to reduce the source/drain resistance. In some embodiments, the epitaxy material comprises SiGe. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecularbeam epitaxy (MBE), liquid-phase epitaxy (LPE), rapid thermal chemical vapor deposition (RTCVD), metalorganic chemical vapor deposition (MOCVD), ultrahigh vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1\times10^{19}$ cm$^{-3}$ to $3\times10^{21}$ cm$^{-3}$, or preferably between $2\times10^{20}$ cm$^{-3}$ to $3\times10^{21}$ cm$^{-3}$.

The gate dielectric 112 may be formed of a high-k dielectric material, although other suitable materials may be used. Examples of high-k materials include but are not limited to metal oxides such as hafnium oxide (HfO$_2$), hafnium silicon oxide (Hf—Si—O), hafnium silicon oxynitride (HfSiON), lanthanum oxide (La$_2$O$_3$), lanthanum aluminum oxide (LaAlO$_3$), zirconium oxide (ZrO$_2$), zirconium silicon oxide, zirconium silicon oxynitride, tantalum oxide (Ta$_2$O$_5$), titanium oxide (TiO$_2$), barium strontium titanium oxide, barium titanium oxide, strontium titanium oxide, yttrium oxide (Y$_2$O$_3$), aluminum oxide (Al$_2$O$_3$), lead scandium tantalum oxide, and lead zinc niobate. The high-k material may further include dopants such as lanthanum (La), aluminum (Al), and magnesium (Mg). The gate dielectric 116 may be formed using ALD or CVD processing, although other suitable processes may be used. The gate dielectric 112 has a uniform thickness in the range of 2 nm to 5 nm, although other thicknesses above or below this range may be used as desired for a particular application.

The gate conductor 114 may be formed of any suitable conducting material, including but not limited to, doped polycrystalline or amorphous silicon, germanium (Ge), silicon germanium (SiGe), a metal (e.g., tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), gold (Au), etc.), a conducting metallic compound material (e.g., tantalum nitride (TaN), titanium nitride (TiN), tantalum carbide (TaC$_x$), titanium carbide (TiC), titanium aluminum carbide, tungsten silicide (WSi$_2$), tungsten nitride (WN), ruthenium oxide (RuO$_2$), cobalt silicide, nickel silicide, etc.), carbon nanotubes, conductive carbon, graphene, or any suitable combination of these and other suitable materials. The conductive material may further comprise dopants that are incorporated during or after deposition. In some embodiments, the gate conductor includes a work function metal (WFM) layer to set the threshold voltage of the nanosheet transistor to a desired value. The WFM may be: a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC); and combinations thereof. The gate conductor 114 may have a uniform thickness in the range of 20 nm to 100 nm, although other thicknesses above or below this range may be used as desired for a particular application. The gate can be patterned by any suitable patterning techniques including but not limited to, lithography followed by etching, sidewall imaging transfer (SIT), etc. The transistor shown in FIG. 10 may further comprise other device structures such as isolation, spacers, contacts, etc. that are not shown for clarity.

The size of the nanotube semiconductor shell 108 can be tuned by the original dimensions of fins 201 (e.g., as desired based on a length of the fins 201). The thickness of the nanotube semiconductor shell 108 can be adjusted by atomic etching or thinning as desired.

Figure 11:
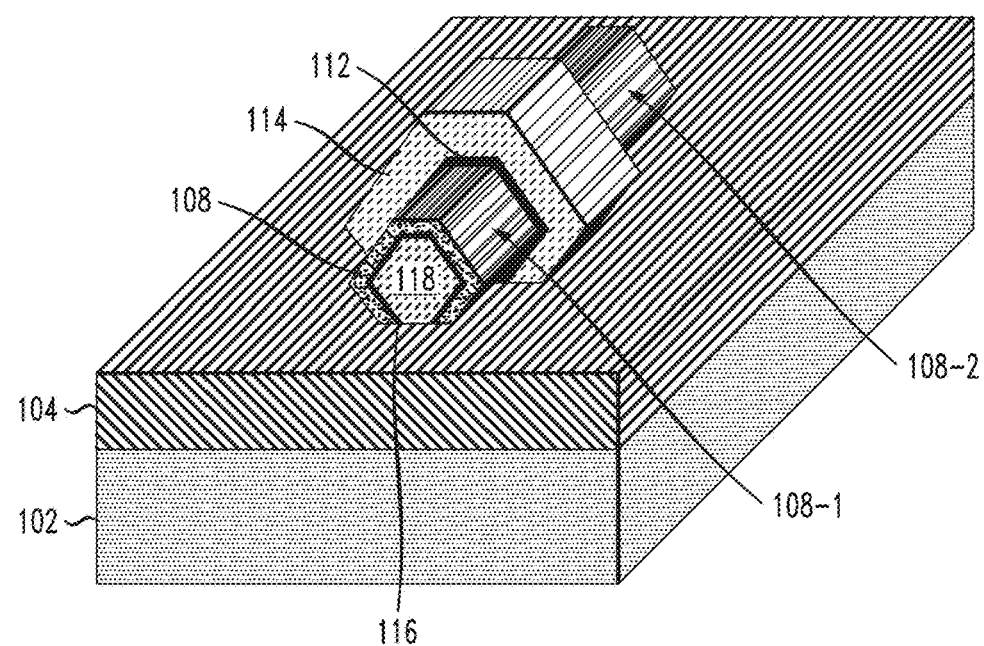
FIG. 11 depicts a perspective view of a hexagonal nanotube transistor with an inner gate, according to an embodiment of the invention.

FIG. 11 depicts a perspective view 1100 of a hexagonal nanotube transistor with an inner gate formed as described above. The hexagonal nanotube transistor shown in FIG. 11 includes substrate 102, BOX layer 104, nanotube semiconductor shell 108 providing source 108-1, drain 108-2 and a channel not labeled below an outer gate comprising gate dielectric 112 and gate conductor 114. These elements may be formed with similar size and similar materials as similarly numbered elements described above.

Rather than having an insulator 110 filled inside the nanotube semiconductor shell 108, the hexagonal nanotube transistor shown in FIG. 11 includes an inner gate comprising inner gate dielectric 116 and an inner gate conductor 118 formed on the inner gate dielectric 116. The inner gate dielectric 116 and inner gate conductor 118 may be formed of similar materials as the outer gate dielectric 112 and outer gate conductor 114. The inner gate dielectric 116 may have a uniform thickness in the range of 2 nm to 5 nm, although other thicknesses outside this range may be used as desired.

The inner gate advantageously acts as a back gate for the hexagonal nanotube transistor for threshold voltage (Vt) tuning. The inner gate may be used for tuning the transistor performance by Vt tuning. Also, both the interior (inner) and exterior (outer) sidewalk of the channel portion of the semiconductor shell 108 are surrounded by gates providing additional performance.

FIGS. 1-11 described above illustrate embodiments that utilize SOI arrangements (e.g., BOX layer 104 disposed over substrate 102). Embodiments, however, are not limited to SOI structures and may instead use a bulk semiconductor substrate to form horizontal lateral semiconductor nanotubes. FIGS. 12-18 describe processing for forming horizontal lateral semiconductor nanotubes from a bulk semiconductor substrate.

FIG. 12 depicts a side cross-sectional view of fins 1201 formed from a bulk semiconductor substrate, which may be formed of materials similar to those described above with respect to substrate 102. The fins 1201 may be formed using SIT or other suitable processing. Each fin 1201 includes a semiconductor pillar 1206 formed on a base portion 1202. The semiconductor pillars 1206 and base portion 1202 are both formed from the bulk semiconductor substrate. For ease of reference below, however, the base portion 1202 is referred to as substrate 1202. The substrate 1202 may have similar sizing as that described above with respect to substrate 102. The pillars 1206, however, may have a larger height or vertical thickness (in direction Y-Y') relative to semiconductor layer 106, such that an exposed portion of the pillars 106 (after formation of dielectric or insulator layer 1204 as described below with respect to FIG. 13) has a similar height as the semiconductor layer 106.

FIG. 13 depicts a side cross-sectional view 1300 of the semiconductor structure shown in FIG. 12 following formation of a dielectric or insulator layer 1204 over a top surface of the substrate 1202 surrounding portions of the sidewalls of the fins 1201. The dielectric 1204 may comprise an oxide, and may be formed by oxide fill or deposition followed by recess to a desired height on the sidewall of pillars 1206.

Figure 14:
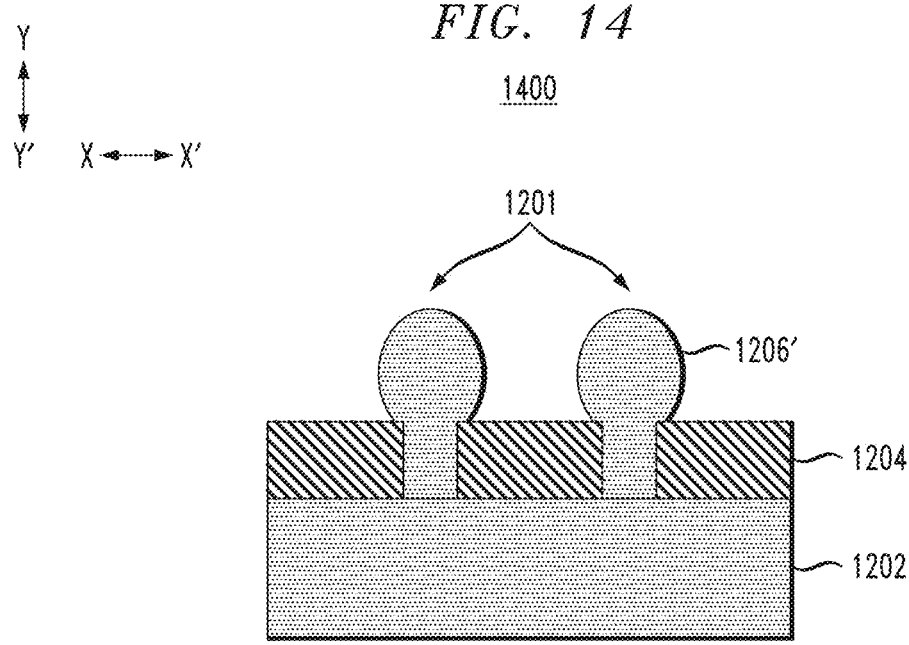
FIG. 14 depicts a side cross-sectional view of the semiconductor structure shown in FIG. 13 following annealing, according to an embodiment of the invention.
Figure 15:
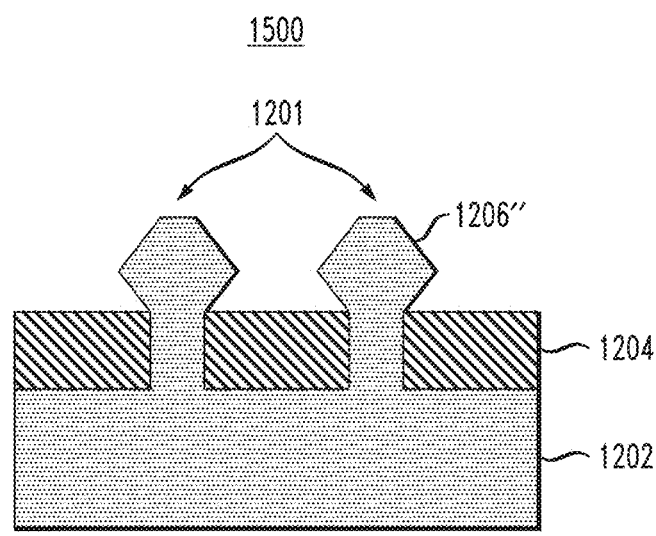
FIG. 15 depicts a side cross-sectional view of the semiconductor structure shown in FIG. 14 following etching to form faceted fins, according to an embodiment of the invention.
Figure 16:
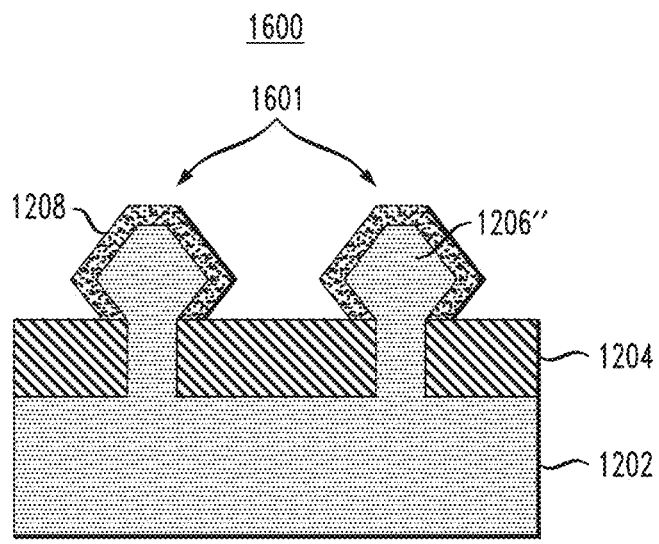
FIG. 16 depicts a side cross-sectional view of the semiconductor structure shown in FIG. 15 following epitaxial growth on the faceted sidewalls of the fins, according to an embodiment of the invention.

FIG. 14 depicts a side cross-sectional view 1400 of the semiconductor structure shown in FIG. 13 following an anneal process similar to that described above with respect to FIG. 3 to form rounded portions of the pillars 1206' above the dielectric 1204. FIG. 15 depicts a side cross-sectional view 1500 of the semiconductor structure shown in FIG. 14 following an etch process similar to that described above with respect to FIG. 4 to form faceted sidewalls of the portions of the pillars 1206" above the dielectric 1204. FIG. 16 depicts a side cross-sectional view 1600 of the semiconductor structure shown in FIG. 15 following epitaxial growth similar to that described above with respect to FIG. 5 to form semiconductor shells 1208 of horizontal semiconductor nanotubes 1601.

The structure of FIG. 16 may be subject to further processing to fill with an oxide or inner gate using techniques similar to those described above. When the core material of pillars 1206" inside the semiconductor shells 1208 is removed, however, portions of the pillars 1206" below the semiconductor shells 1208 are also removed, creating an indent below the horizontal semiconductor nanotubes 1601. When the insulator (or alternatively inner gate) is filled in the semiconductor shells 1208, the insulator (or alternatively inner gate) also fills the indent. The horizontal semiconductor nanotubes 1601 are anchored by the insulator layer 1204 during this process.

Figure 17:
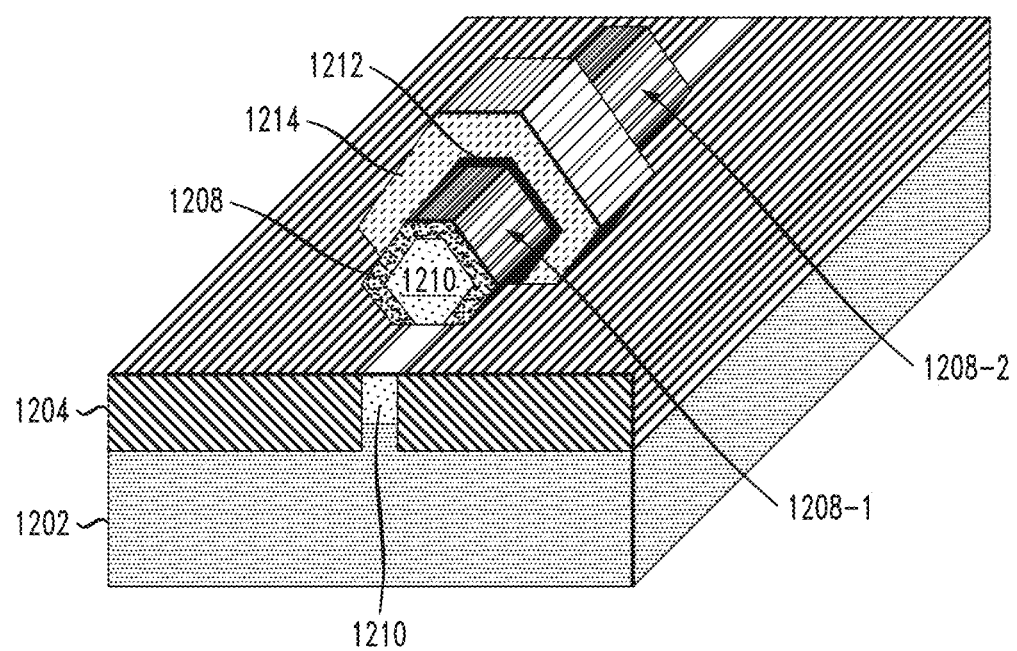
FIG. 17 depicts a perspective view of a hexagonal nanotube transistor formed from a bulk semiconductor substrate, according to an embodiment of the invention.

FIG. 17 depicts a perspective view 1700 of a hexagonal nanotube transistor formed using techniques described above with respect to FIGS. 12-16. As shown, the hexagonal nanotube transistor includes substrate 1202, dielectric layer 1204, and semiconductor nanotube shell 1208 formed as described above. In addition, the core of the semiconductor nanotube shell 1208 is filled with an insulator 1210 that also fills an indent in the pillar below the semiconductor nanotube shell 1208 as illustrated. A gate dielectric 1212 and gate conductor 1214 are formed over the semiconductor nanotube shell 1208 in a manner similar to that described above with respect to gate dielectric 112 and gate conductor 114 of FIG. 10. Also similar to FIG. 10, the semiconductor nanotube shell 1208 provides a source region 1208-1 and a drain region 1208-2 (as well as a channel portion beneath the gate which is not labeled).

FIG. 18 depicts a perspective view 1800 of a hexagonal nanotube transistor formed using techniques described above with respect to FIGS. 12-16, but with an inner gate filling the semiconductor nanotube shell 1208 rather than insulator 1210. The inner gate includes inner gate dielectric 1216 and inner gate conductor 1218 similar to the inner gate dielectric 116 and inner gate conductor 118 described above with respect to FIG. 11.

The hexagonal nanotube transistor of FIG. 18 further includes the inner gate dielectric 1216 and inner gate conductor 1218 formed in the indent region of the pillar below the semiconductor nanotube shell 1208. The inner gate (comprising the inner gate dielectric 1216 and inner gate conductor 1218) fills the core of the semiconductor nanotube shell as well as the indent region. Material of the inner gate may initially be filled or formed in regions outside the semiconductor nanotube shell 1208. Such inner gate material formed in regions outside the semiconductor nanotube shell can be recessed, using a directional etch such as RIE.

FIG. 19 depicts a perspective view 1900 of a hexagonal nanotube transistor formed using techniques described above with respect to FIGS. 12-16, with an insulator 1210 in the indent region and an inner gate comprising inner gate dielectric 1216 and inner gate conductor 1218 filling a core of the semiconductor nanotube shell. As illustrated in FIG. 19, the hexagonal nanotube transistor includes the insulator 1210 formed in the indent region of the pillar below the core of the semiconductor nanotube shell 1208. Since the indent region is narrower than the semiconductor nanotube shell 1208, the insulator material 1210 can be deposited with a thickness that is greater than half of the lateral width of the indent region, so that the insulator material 1210 will pinch off (e.g., completely fill) the indent region. The insulator thickness is less than half of the vertical height of the hexagonal nanotube transistor such that the insulator material 1210 only partially fills the semiconductor nanotube shell 1208. After deposition, an etch back process with an etch target equal or slightly greater than the deposition target is performed, so that after the etch back process the insulator material 1210 is removed from the core of the semiconductor nanotube shell 1208 while it still remains in the indent region.

In some embodiments, a method of forming a semiconductor structure comprises forming one or more fins disposed on a substrate, rounding surfaces of the one or more fins, forming faceted sidewalls from the rounded surfaces of the one or more fins, and forming a lateral semiconductor nanotube shell on the faceted sidewalls. The lateral semiconductor nanotube shell comprises a hexagonal shape.

Forming the one or more fins may comprise forming the substrate, forming an insulator on a top surface of the substrate, forming a semiconductor layer disposed over a top surface of the insulator, and patterning the one or more fins from the semiconductor layer. Forming the one or more fins may alternately comprise patterning one or more fins in the substrate and forming an insulator layer disposed over a top surface of the substrate surrounding the one or more fins.

Rounding the surfaces of the one or more fins may comprise annealing, such as performing an anneal in hydrogen. The etching may comprise etching with HCl vapor. The etchant use in the etching may be dependent on crystalline orientation such that the etching stops on reaching a {111} crystalline orientation of material of the one or more fins. Forming the lateral semiconductor nanotube shell may comprise epitaxially growth of a semiconductor material on the faceted sidewalls of the one or more fins. The semiconductor material may comprise SiGe.

The method may further comprise removing material of the one or more fins inside the lateral semiconductor nanotube shell. In some embodiments, the method further comprises filling the lateral semiconductor nanotube shell with an insulator and etching back to expose outer sidewalls of the lateral semiconductor nanotube shell. In other embodiments, the method further comprises forming an inner gate dielectric disposed on interior sidewalls of the lateral semiconductor nanotube shell, forming an inner gate conductor disposed on interior sidewalls of the inner gate dielectric, forming an outer gate dielectric disposed on exterior sidewalls of the lateral semiconductor nanotube shell, and forming an outer gate conductor disposed on the outer gate dielectric.

The method may further comprise forming a gate dielectric disposed over a portion of exterior sidewalls of the lateral semiconductor nanotube shell and forming a gate conductor disposed over the gate dielectric.

In some embodiments, a semiconductor structure comprises a substrate and a lateral semiconductor nanotube shell disposed on a top surface of the substrate. The lateral semiconductor nanotube shell comprises a hexagonal shape. The lateral semiconductor nanotube shell may comprise SiGe. The SiGe may comprise single-crystal SiGe with a {111} crystalline orientation.

The semiconductor structure may further comprise an insulator filled in the lateral semiconductor nanotube shell, a gate dielectric disposed over a portion of exterior sidewalls of the lateral semiconductor nanotube shell, and a gate conductor disposed over the gate dielectric. The semiconductor structure may alternately further comprise an inner gate dielectric disposed on interior sidewalk of the lateral semiconductor nanotube shell, an inner gate conductor disposed on interior sidewalls of the lateral semiconductor nanotube shell, an outer gate dielectric disposed over a portion of exterior sidewalls of the lateral semiconductor nanotube shell, and an outer gate conductor disposed over the outer gate dielectric.

In some embodiments, an integrated circuit comprises a lateral nanotube transistor comprising a substrate and a lateral semiconductor nanotube shell disposed on a top surface of the substrate. The lateral semiconductor nanotube shell comprises a hexagonal shape.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a substrate;
   a lateral semiconductor nanotube shell disposed on a top surface of the substrate; and
   an insulating layer disposed on interior sidewalls of the lateral semiconductor nanotube shell;
   wherein the lateral semiconductor nanotube shell comprises a hexagonal shape.

2. The semiconductor structure of claim 1, wherein the lateral semiconductor nanotube shell comprises silicon germanium (SiGe).

3. The semiconductor structure of claim 1, wherein the lateral semiconductor nanotube shell comprises single-crystal SiGe with a {111} crystalline orientation.

4. The semiconductor structure of claim 1, further comprising:
   the insulating layer filled in the lateral semiconductor nanotube shell and disposed on the interior sidewalls of the lateral semiconductor nanotube shell;
   a gate dielectric disposed over a portion of exterior sidewalls of the lateral semiconductor nanotube shell; and
   a gate conductor disposed over the gate dielectric.

5. The semiconductor structure of claim 1, further comprising:
   the insulating layer providing an inner gate dielectric disposed on the interior sidewalls of the lateral semiconductor nanotube shell;
   an inner gate conductor disposed on the interior sidewalls of the inner gate dielectric;
   an outer gate dielectric disposed over a portion of exterior sidewalls of the lateral semiconductor nanotube shell; and
   an outer gate conductor disposed over the outer gate dielectric.

6. The semiconductor structure of claim 1, further comprising a dielectric layer disposed between the top surface of the substrate and the lateral semiconductor nanotube shell.

7. The semiconductor structure of claim 1, further comprising, between the top surface of the substrate and the lateral semiconductor nanotube shell:
   a fin of substrate material;
   an indent region disposed over the fin of substrate material below the lateral semiconductor nanotube shell; and
   a dielectric layer surrounding the fin of substrate material and the indent region.

8. The semiconductor structure of claim 7, further comprising:
   the insulating layer filled in the lateral semiconductor nanotube shell and the indent region;
   a gate dielectric disposed over a portion of exterior sidewalls of the lateral semiconductor nanotube shell; and
   a gate conductor disposed over the gate dielectric.

9. The semiconductor structure of claim 7, further comprising:
   the insulating layer providing an inner gate dielectric disposed on the interior sidewalls of the lateral semiconductor nanotube, sidewalls of the indent region, and a top surface of the fin of substrate material;
   an inner gate conductor disposed on interior sidewalls of the inner gate dielectric;

an outer gate dielectric disposed over a portion of exterior sidewalls of the lateral semiconductor nanotube shell; and an outer gate conductor disposed over the outer gate dielectric.

10. The semiconductor structure of claim 7, further comprising:

an insulator filled in the indent region;

the insulating layer providing an inner gate dielectric disposed on the interior sidewalls of the lateral semiconductor nanotube;

an inner gate conductor disposed on interior sidewalls of the inner gate dielectric;

an outer gate dielectric disposed over a portion of exterior sidewalls of the lateral semiconductor nanotube shell; and an outer gate conductor disposed over the outer gate dielectric.

11. An integrated circuit comprising:

a lateral nanotube transistor comprising:

a substrate;

a lateral semiconductor nanotube shell disposed on a top surface of the substrate; and an insulating layer disposed on interior sidewalls of the lateral semiconductor nanotube shell;

wherein the lateral semiconductor nanotube shell comprises a hexagonal shape.

12. The integrated circuit of claim 11, wherein the lateral semiconductor nanotube shell comprises silicon germanium (SiGe).

13. The integrated circuit of claim 11, wherein the lateral semiconductor nanotube shell comprises single-crystal SiGe with a {111} crystalline orientation.

14. The integrated circuit of claim 11, further comprising:

the insulating layer filled in the lateral semiconductor nanotube shell and disposed on the interior sidewalls of the lateral semiconductor nanotube shell;

a gate dielectric disposed over a portion of exterior sidewalls of the lateral semiconductor nanotube shell; and a gate conductor disposed over the gate dielectric.

15. The integrated circuit of claim 11, further comprising:

the insulating layer providing an inner gate dielectric disposed on interior sidewalls of the lateral semiconductor nanotube shell;

an inner gate conductor disposed on the interior sidewalls of the inner gate dielectric;

an outer gate dielectric disposed over a portion of exterior sidewalls of the lateral semiconductor nanotube shell; and an outer gate conductor disposed over the outer gate dielectric.

16. The integrated circuit of claim 11, further comprising a dielectric layer disposed between the top surface of the substrate and the lateral semiconductor nanotube shell.

17. The integrated circuit of claim 11, further comprising, between the top surface of the substrate and the lateral semiconductor nanotube shell:

a fin of substrate material;

an indent region disposed over the fin of substrate material below the lateral semiconductor nanotube shell; and a dielectric layer surrounding the fin of substrate material and the indent region.

18. The integrated circuit of claim 17, further comprising:

the insulating layer filled in the lateral semiconductor nanotube shell and the indent region;

a gate dielectric disposed over a portion of exterior sidewalls of the lateral semiconductor nanotube shell; and a gate conductor disposed over the gate dielectric.

19. The integrated circuit of claim 17, further comprising:

the insulating layer providing an inner gate dielectric disposed on the interior sidewalls of the lateral semiconductor nanotube, sidewalls of the indent region, and a top surface of the fin of substrate material;

an inner gate conductor disposed on interior sidewalls of the inner gate dielectric;

an outer gate dielectric disposed over a portion of exterior sidewalls of the lateral semiconductor nanotube shell; and an outer gate conductor disposed over the outer gate dielectric.

20. The integrated circuit of claim 17, further comprising:

an insulator filled in the indent region;

the insulating layer providing an inner gate dielectric disposed on the interior sidewalls of the lateral semiconductor nanotube;

an inner gate conductor disposed on interior sidewalls of the inner gate dielectric;

an outer gate dielectric disposed over a portion of exterior sidewalls of the lateral semiconductor nanotube shell; and an outer gate conductor disposed over the outer gate dielectric.

* * * * *